United States Patent
Tang et al.

(10) Patent No.: US 12,431,870 B2
(45) Date of Patent: *Sep. 30, 2025

(54) SURFACE ACOUSTIC WAVE DEVICE

(71) Applicant: Skyworks Solutions, Inc., Irvine, CA (US)

(72) Inventors: Gong Bin Tang, Moriguchi (JP); Rei Goto, Osaka (JP); Hiroyuki Nakamura, Osaka-Fu (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/749,226

(22) Filed: Jun. 20, 2024

(65) Prior Publication Data

US 2024/0339987 A1    Oct. 10, 2024

Related U.S. Application Data

(63) Continuation of application No. 18/173,594, filed on Feb. 23, 2023, now Pat. No. 12,040,784, which is a continuation of application No. 17/096,272, filed on Nov. 12, 2020, now Pat. No. 11,616,491.

(60) Provisional application No. 62/937,425, filed on Nov. 19, 2019.

(51) Int. Cl.
   *H03H 9/64*     (2006.01)
   *H03H 3/08*     (2006.01)
   *H03H 9/02*     (2006.01)

(52) U.S. Cl.
   CPC ............ *H03H 9/6489* (2013.01); *H03H 3/08* (2013.01); *H03H 9/02992* (2013.01)

(58) Field of Classification Search
   CPC .... H03H 9/6489; H03H 3/08; H03H 9/02992; H03H 9/02559; H03H 9/02858; H03H 9/02881; H03H 9/6483; H03H 9/725; H03H 9/02574
   USPC ......................................... 333/133, 193–196
   See application file for complete search history.

(56) References Cited

U.S. PATENT DOCUMENTS

| | | | |
|---|---|---|---|
| 11,616,491 B2 | 3/2023 | Tang et al. | |
| 12,040,784 B2 * | 7/2024 | Tang | H03H 3/08 |
| 2013/0051588 A1 | 2/2013 | Ruile et al. | |
| 2013/0249647 A1 | 9/2013 | Nakanishi et al. | |
| 2014/0062614 A1 | 3/2014 | Park | |
| 2015/0333731 A1 * | 11/2015 | Komatsu | H03H 9/25 |
| | | | 310/313 D |
| 2017/0170808 A1 | 6/2017 | Iwaki et al. | |
| 2021/0152154 A1 | 5/2021 | Tang et al. | |
| 2023/0308081 A1 | 9/2023 | Tang et al. | |

\* cited by examiner

*Primary Examiner* — Jorge L Salazar, Jr.
(74) *Attorney, Agent, or Firm* — Knobbe, Martens, Olson & Bear, LLP

(57) ABSTRACT

Aspects of this disclosure relate to a surface acoustic wave device. The surface acoustic wave device includes a piezoelectric layer and an interdigital transducer. The interdigital transducer electrode includes a pair of electrodes, each electrode having a bus bar and fingers extending from the bus bar. The interdigital transducer electrode has an interdigital region defined by a portion of the fingers of the electrodes that interdigitate with each other. A dielectric layer is disposed over the interdigital transducer electrode outside the interdigital region and configured to reduce a loss of the surface acoustic wave device.

20 Claims, 15 Drawing Sheets

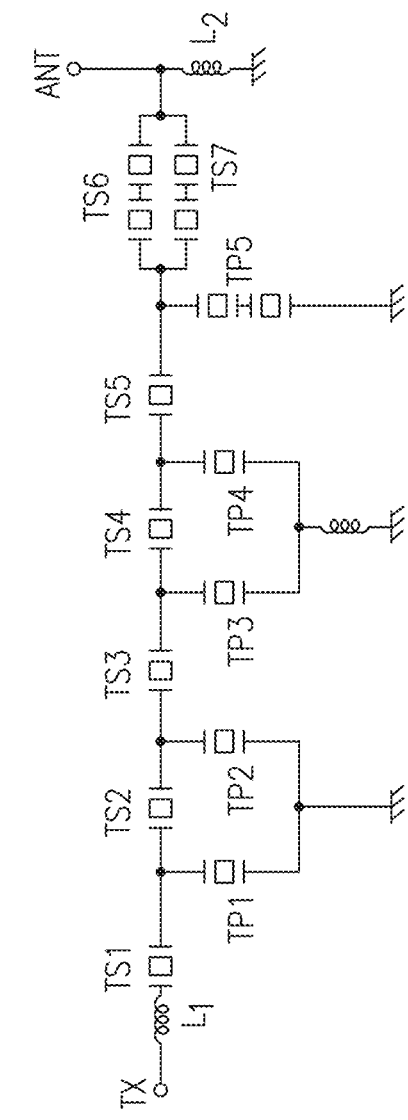
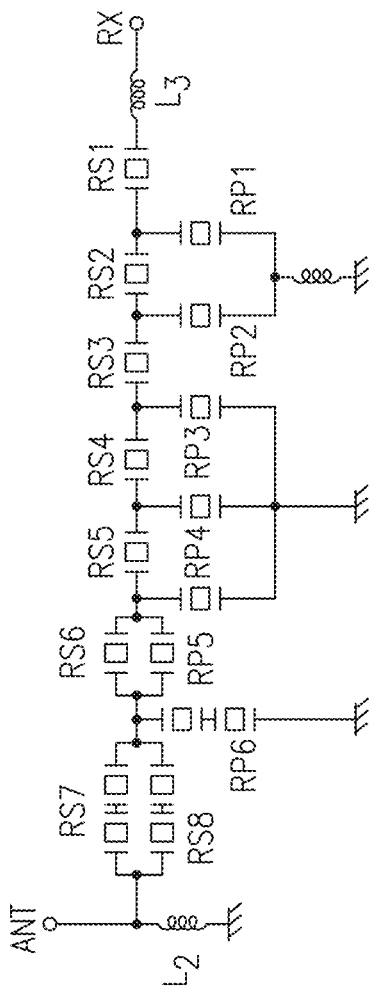
FIG.8A
FIG.8B

SURFACE ACOUSTIC WAVE DEVICE

CROSS REFERENCE TO PRIORITY APPLICATION

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

A surface acoustic wave resonator can include a multilayer piezoelectric substrate. Such a surface acoustic wave resonator can achieve a high quality factor (Q). There is a desire for improved loss performance of surface acoustic wave resonators with multi-layer piezoelectric substrates.

SUMMARY

Accordingly, there is a need for a surface acoustic wave resonator with an improved loss performance. The innovations described in the claims each have several aspects, no single one of which is solely responsible for its desirable attributes. Without limiting the scope of the claims, some prominent features of this disclosure will now be briefly described.

In accordance with one aspect, a surface acoustic wave device is provided. The surface acoustic wave device comprises a piezoelectric layer and an interdigital transducer electrode including a pair of electrodes. Each electrode has a bus bar and fingers extending from the bus bar. The interdigital transducer electrode has an interdigital region defined by a portion of the fingers of the electrodes that interdigitate with each other. A dielectric layer is disposed over the interdigital transducer electrode outside the interdigital region and configured to reduce a loss of the surface acoustic wave device.

In one embodiment, the dielectric layer is a tantalum pentoxide layer.

In one embodiment, the surface acoustic wave device further includes a functional layer below the piezoelectric layer and a support substrate layer below the functional layer. The functional layer can be a silicon dioxide layer. The functional layer can include a first functional layer and a second functional layer. The surface acoustic wave device can further include a metal layer between the first functional layer and the second functional layer.

In one embodiment, the surface acoustic wave device further includes a support substrate layer below the piezoelectric layer. The support substrate layer can include silicon.

In one embodiment, the surface acoustic wave device further includes a silicon dioxide layer disposed over the interdigital transducer electrode. The dielectric layer can be disposed over the silicon dioxide layer.

In one embodiment, the dielectric layer is disposed over the bus bar of the interdigital transducer electrode. The dielectric layer can be disposed over a dummy region of the interdigital transducer electrode. The dielectric layer can be disposed over a gap region of the interdigital transducer electrode. The dielectric layer can be disposed over a gap region of the interdigital transducer electrode.

In one embodiment, the dielectric layer is disposed over a dummy region and a gap region of the interdigital transducer electrode.

In one embodiment, the dielectric layer is disposed over a dummy region of the interdigital transducer electrode.

In one embodiment, the dielectric layer is disposed over a gap region of the interdigital transducer electrode.

In one embodiment, the dielectric layer has a thickness of between 0.01 L and 0.04 L, where L is a wavelength of a wave generated by the surface acoustic wave device.

In one embodiment, the piezoelectric layer is one of a lithium tantalate layer and a lithium niobate layer.

In accordance with another aspect, an acoustic wave filter is provided. The acoustic wave filter comprises a surface acoustic wave resonator configured to filter a radio frequency signal. The surface acoustic wave resonator includes a piezoelectric layer and an interdigital transducer electrode. The interdigital transducer electrode includes a pair of electrodes, each electrode having a bus bar and fingers extending from the bus bar. The interdigital transducer electrode has an interdigital region defined by a portion of the fingers of the electrodes that interdigitate with each other. A dielectric layer is disposed over the interdigital transducer electrode outside the interdigital region and configured to reduce a loss of the surface acoustic wave resonator.

In one embodiment, the dielectric layer is a tantalum pentoxide layer.

In one embodiment, the acoustic wave filter further includes a functional layer below the piezoelectric layer and a support substrate layer below the functional layer. The functional layer can be a silicon dioxide layer. The functional layer can include a first functional layer and a second functional layer. The acoustic wave filter can further include a metal layer between the first functional layer and the second functional layer.

In one embodiment, the acoustic wave filter further includes a support substrate layer below the piezoelectric layer. The support substrate layer can include silicon.

In one embodiment, the acoustic wave filter further includes a silicon dioxide layer disposed over the interdigital transducer electrode. The dielectric layer can be disposed over the silicon dioxide layer.

In one embodiment, the dielectric layer is disposed over the bus bar of the interdigital transducer electrode. The dielectric layer can be disposed over a dummy region of the interdigital transducer electrode. The dielectric layer can be disposed over a gap region of the interdigital transducer electrode. The dielectric layer can be disposed over a gap region of the interdigital transducer electrode.

In one embodiment, the dielectric layer is disposed over a dummy region and a gap region of the interdigital transducer electrode.

In one embodiment, the dielectric layer is disposed over a dummy region of the interdigital transducer electrode.

In one embodiment, the dielectric layer is disposed over a gap region of the interdigital transducer electrode.

In one embodiment, the dielectric layer has a thickness of between 0.01 L and 0.04 L, where L is a wavelength of a wave generated by the surface acoustic wave resonator.

In one embodiment, the piezoelectric layer is one of a lithium tantalate layer and a lithium niobate layer.

In accordance with another aspect, a radio frequency module is provided. The radio frequency module comprises a package substrate and a surface acoustic wave component. The surface acoustic wave component includes a piezoelectric layer and an interdigital transducer electrode. The interdigital transducer electrode includes a pair of electrodes, each electrode having a bus bar and fingers extending from the bus bar. The interdigital transducer electrode has an interdigital region defined by a portion of the fingers of the electrodes that interdigitate with each other. A dielectric layer is disposed over the interdigital transducer electrode outside the interdigital region and configured to reduce a loss of the surface acoustic wave component. The radio frequency module further includes additional circuitry, the surface acoustic wave component and additional circuitry disposed on the package substrate.

In one embodiment, the dielectric layer is a tantalum pentoxide layer.

In one embodiment, the radio frequency module further includes a functional layer below the piezoelectric layer and a support substrate layer below the functional layer. The functional layer can be a silicon dioxide layer. The functional layer can include a first functional layer and a second functional layer. The radio frequency module can further include a metal layer between the first functional layer and the second functional layer.

In one embodiment, the radio frequency module further includes a support substrate layer below the piezoelectric layer. The support substrate layer can include silicon.

In one embodiment, the radio frequency module further includes a silicon dioxide layer disposed over the interdigital transducer electrode. The dielectric layer disposed over the silicon dioxide layer.

In one embodiment, the dielectric layer is disposed over the bus bar of the interdigital transducer electrode. The dielectric layer can be disposed over a dummy region of the interdigital transducer electrode. The dielectric layer can be disposed over a gap region of the interdigital transducer electrode. The dielectric layer can be disposed over a gap region of the interdigital transducer electrode. The dielectric layer can be disposed over a dummy region and a gap region of the interdigital transducer electrode.

In one embodiment, the dielectric layer is disposed over a dummy region of the interdigital transducer electrode.

In one embodiment, the dielectric layer is disposed over a gap region of the interdigital transducer electrode.

In one embodiment, the dielectric layer has a thickness of between 0.01 L and 0.04 L, where L is a wavelength of a wave generated by the surface acoustic wave component.

In one embodiment, the piezoelectric layer is one of a lithium tantalate layer and a lithium niobate layer.

In accordance with another aspect, a wireless communication device is provided. The wireless communication device comprises an antenna and a front end module. The front end module includes one or more surface acoustic wave resonators configured to filter a radio frequency signal associated with the antenna. Each surface acoustic wave resonator includes a piezoelectric layer and an interdigital transducer electrode. The interdigital transducer electrode includes a pair of electrodes, each electrode having a bus bar and fingers extending from the bus bar. The interdigital transducer electrode has an interdigital region defined by a portion of the fingers of the electrodes that interdigitate with each other. A dielectric layer is disposed over the interdigital transducer electrode outside the interdigital region and configured to reduce a loss of the surface acoustic wave resonator.

In one embodiment, the dielectric layer is a tantalum pentoxide layer.

In one embodiment, the wireless communication device further includes a functional layer below the piezoelectric layer and a support substrate layer below the functional layer. The functional layer can be a silicon dioxide layer. The functional layer can include a first functional layer and a second functional layer. The wireless communication device can further include a metal layer between the first functional layer and the second functional layer.

In one embodiment, the wireless communication device further includes a support substrate layer below the piezoelectric layer. The support substrate layer can include silicon.

In one embodiment, the wireless communication device further includes a silicon dioxide layer disposed over the interdigital transducer electrode. The dielectric layer can be disposed over the silicon dioxide layer.

In one embodiment, the dielectric layer is disposed over the bus bar of the interdigital transducer electrode. The dielectric layer can be disposed over a dummy region of the interdigital transducer electrode. The layer can be disposed over a gap region of the interdigital transducer electrode. The dielectric layer can be disposed over a gap region of the interdigital transducer electrode.

In one embodiment, the dielectric layer is disposed over a dummy region and a gap region of the interdigital transducer electrode.

In one embodiment, the dielectric layer is disposed over a dummy region of the interdigital transducer electrode.

In one embodiment, the dielectric layer is disposed over a gap region of the interdigital transducer electrode.

In one embodiment, the dielectric layer has a thickness of between 0.01 L and 0.04 L, where L is a wavelength of a wave generated by the one or more surface acoustic wave resonators.

In one embodiment, the piezoelectric layer is one of a lithium tantalate layer and a lithium niobate layer.

In accordance with another aspect, a method of manufacturing a surface acoustic wave resonator is provided. The method comprises forming or providing piezoelectric layer and forming or providing an interdigital transducer electrode. The interdigital transducer electrode includes a pair of electrodes, each electrode having a bus bar and fingers extending from the bus bar. The interdigital transducer electrode has an interdigital region defined by a portion of the fingers of the electrodes that interdigitate with each other. The method also includes forming or providing a dielectric layer over the interdigital transducer electrode outside the interdigital region, the dielectric layer configured to reduce a loss of the surface acoustic wave resonator.

In one embodiment, the dielectric layer is a tantalum pentoxide layer.

In one embodiment, the method further includes forming or providing a functional layer below the piezoelectric layer and forming or providing a support substrate layer below the functional layer. The functional layer can be a silicon dioxide layer. The forming or providing the functional layer can include forming or providing a first functional layer and forming or providing a second functional layer. The method can further include forming or providing a metal layer between the first functional layer and the second functional layer.

In one embodiment, the method further includes forming or providing a support substrate layer below the piezoelectric layer. The support substrate layer can include silicon.

In one embodiment, the method further includes forming or providing a silicon dioxide layer over the interdigital transducer electrode. The dielectric layer disposed over the silicon dioxide layer.

In one embodiment, the dielectric layer is disposed over the bus bar of the interdigital transducer electrode. The dielectric layer can be disposed over a dummy region of the interdigital transducer electrode. The dielectric layer can be disposed over a gap region of the interdigital transducer electrode. The dielectric layer can be disposed over a gap region of the interdigital transducer electrode.

In one embodiment, the dielectric layer is disposed over a dummy region and a gap region of the interdigital transducer electrode.

In one embodiment, the dielectric layer is disposed over a dummy region of the interdigital transducer electrode.

In one embodiment, the dielectric layer is disposed over a gap region of the interdigital transducer electrode.

In one embodiment, the dielectric layer has a thickness of between 0.01 L and 0.04 L, where L is a wavelength of a wave generated by the surface acoustic wave resonator.

In one embodiment, the piezoelectric layer is one of a lithium tantalate layer and a lithium niobate layer.

In accordance with another aspect, a method of filtering a radio frequency signal is provided. The method comprises receiving a radio frequency signal at an input port of an acoustic wave filter that includes a surface acoustic wave resonator. The surface acoustic wave resonator includes a piezoelectric layer and an interdigital transducer electrode. The interdigital transducer electrode includes including a pair of electrodes, each electrode having a bus bar and fingers extending from the bus bar. The interdigital transducer electrode has an interdigital region defined by a portion of the fingers of the electrodes that interdigitate with each other. A dielectric layer is disposed over the interdigital transducer electrode outside the interdigital region and configured to reduce a loss of the surface acoustic wave resonator. The method also includes filtering the radio frequency signal with the acoustic wave filter.

In one embodiment, the dielectric layer is a tantalum pentoxide layer.

In one embodiment, the dielectric layer is disposed over the bus bar of the interdigital transducer electrode. The dielectric layer can be disposed over a dummy region of the interdigital transducer electrode. The dielectric layer can be disposed over a gap region of the interdigital transducer electrode. The dielectric layer can be disposed over a gap region of the interdigital transducer electrode.

In one embodiment, the dielectric layer is disposed over a dummy region and a gap region of the interdigital transducer electrode.

In one embodiment, the dielectric layer is disposed over a dummy region of the interdigital transducer electrode.

In one embodiment, the dielectric layer is disposed over a gap region of the interdigital transducer electrode.

In one embodiment, the dielectric layer has a thickness of between 0.01 L and 0.04 L, where L is a wavelength of a wave generated by the surface acoustic wave resonator.

In one embodiment, the piezoelectric layer is one of a lithium tantalate layer and a lithium niobate layer.

BRIEF DESCRIPTION OF THE DRAWINGS

Embodiments of this disclosure will now be described, by way of non-limiting example, with reference to the accompanying drawings.

FIG. 8A is a schematic diagram of a transmit filter that includes a surface acoustic wave resonator according to an embodiment.

FIG. 8B is a schematic diagram of a receive filter that includes a surface acoustic wave resonator according to an embodiment.

DETAILED DESCRIPTION OF CERTAIN EMBODIMENTS

Figure 1:
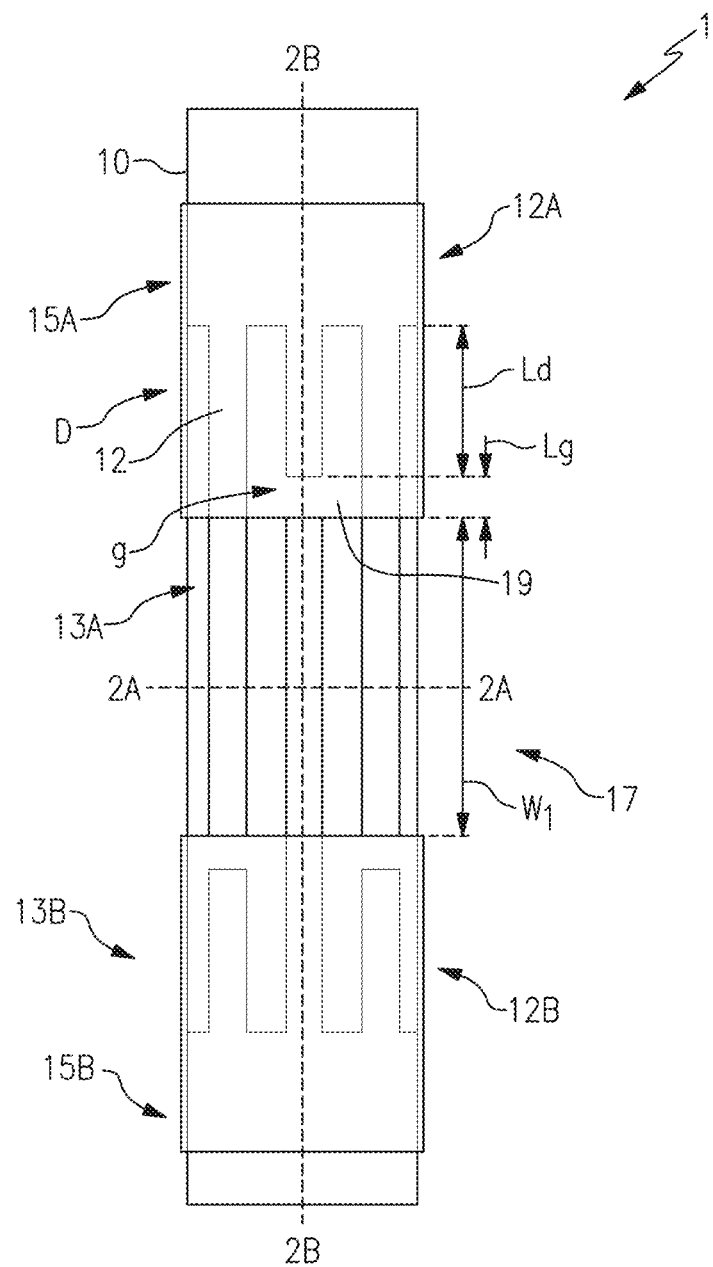
FIG. 1 illustrates a top view of a surface acoustic wave (SAW) resonator according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. Certain SAW devices may be referred to as SAW resonators. Any features of the SAW resonators discussed herein can be implemented in any suitable SAW device.

In general, high quality factor (Q), large effective electromechanical coupling coefficient ($k^2$), high frequency ability, and spurious free response can be significant aspects for acoustic wave elements to enable low-loss filters, delay lines, stable oscillators, and sensitive sensors.

Multi-layer piezoelectric substrate (MPS) SAW resonators can thermally insulate an interdigital transducer electrode and a piezoelectric layer. By reducing dissipative thermal impedance of the SAW device, the ruggedness and power handling can be improved.

Some MPS SAW resonators have achieved high Q by confining energy and good thermal dissipation using a silicon (Si) support layer. However, such approaches have encountered technical challenges related to undesirable higher frequency spurious responses.

Some other MPS SAW resonators have achieved high Q by confining energy and have also reduced higher frequency spurious responses. However, such approaches have encountered relatively low thermal heat dissipation.

Aspects of the present disclosure relate to SAW resonators that include a supporting substrate (e.g., a single crystal supporting substrate), a quartz layer (e.g., a z-propagation quartz layer) over the supporting substrate, a piezoelectric layer (e.g., a lithium niobate (LN) layer or a lithium tantalate (LT) layer) over the quartz layer, and an interdigital transducer (IDT) electrode over the piezoelectric layer. Such SAW resonators can also include a temperature compensation layer (e.g., silicon dioxide ($SiO_2$) layer) over the IDT electrode in certain embodiments. The SAW resonators can also include an adhesion layer disposed between the supporting substrate and the quartz layer and/or an adhesion layer between the quartz layer and the piezoelectric layer, in certain applications.

SAW resonators with the quartz layer and the support substrate can beneficially provide a relatively high effective electromechanical coupling coefficient ($k^2$), a relatively high quality factor (Q), a relatively high power durability and thermal dissipation, and reduced high frequency spurious responses. The high coupling coefficient ($k^2$) can be beneficial for relatively wide bandwidth filters. The high quality factor (Q) can beneficially lead to a relatively low insertion loss for a filter. The reduced high frequency spurious may make the SAW resonators compatible with multiplexing with higher frequency bands.

In an embodiment, an MPS SAW resonator includes a piezoelectric layer over a quartz layer over a silicon support substrate. The silicon support substrate can reduce thermal impedance of the MPS SAW resonator. The quartz layer can be a single crystal layer arranged to confine acoustic energy and lower a higher frequency spurious response. The quartz layer can be a z-propagation quartz layer. The piezoelectric layer, the quartz layer, and the silicon support substrate can all be single crystal layers.

Embodiments of MPS SAW resonators will now be discussed. Any suitable principles and advantages of these MPS SAW resonators can be implemented together with each other in an MPS SAW resonator and/or in an acoustic wave filter. MPS SAW resonators disclosed herein can have lower loss than certain bulk acoustic wave devices. SAW resonators disclosed herein can reduce insertion loss for a filter that includes the SAW resonators disclosed herein. There is a desire for reduced insertion loss for SAW filters, and reducing loss of a SAW resonator of the SAW filter should reduce the insertion loss of the SAW filter.

Figure 2A:
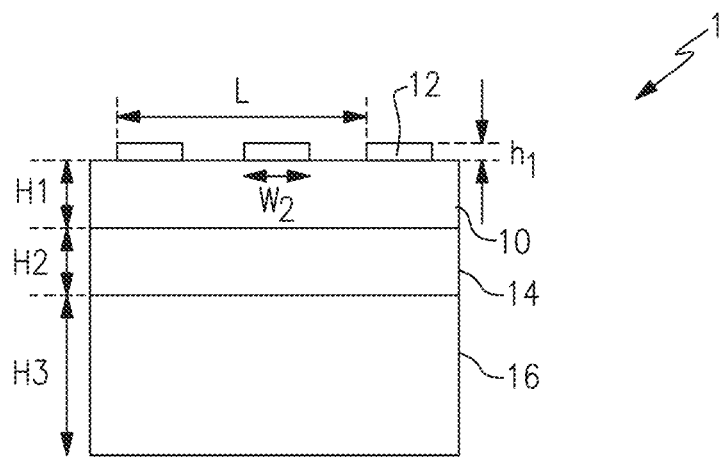
FIG. 2A illustrates a cross section of the SAW resonator of FIG. 1 along line 2A-2A.
Figure 2B:
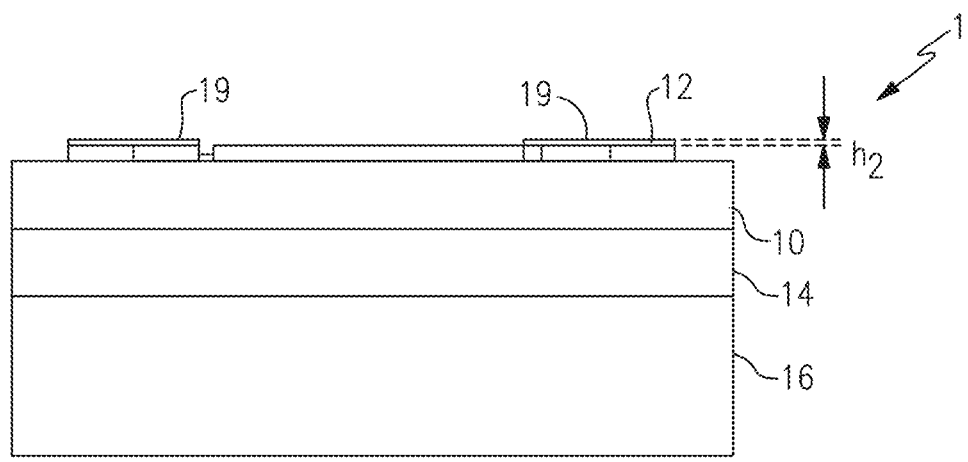
FIG. 2B illustrates a cross section of the SAW resonator of FIG. 1 along line 2B-2B.

FIGS. 1-2B illustrate a surface acoustic wave (SAW) resonator or device 1 according to an embodiment. FIG. 1 shows a top view of the SAW resonator 1, while FIGS. 2A and 2B show cross-sections of the SAW resonator 1 about lines 2A-2A and 2B-2B, respectively. The illustrated SAW resonator 1 includes a piezoelectric layer 10, an interdigital electrode transducer (IDT) electrode 12 over the piezoelectric layer 10, a functional layer 14 below the piezoelectric layer 10, and a support substrate 16 below the functional layer 14. In one example, the SAW resonator 1, the piezoelectric layer 10, the functional layer 14, and the support substrate 16 can each be a single crystal layer. The SAW resonator 1 generates a surface acoustic wave having a wavelength λ or L.

The piezoelectric layer 10 can be any suitable piezoelectric layer, such as a lithium based piezoelectric layer. In some embodiments, the piezoelectric layer 10 can be a lithium tantalate (LT) layer. In some other embodiments, the piezoelectric layer 10 can be a lithium niobate (LN) layer. The piezoelectric layer 10 has an orientation that can be expressed in Euler angles ($\varphi$, $\theta$, $\Psi$).

According to some applications, the piezoelectric layer 10 can be an LT layer having a first Euler angle q in a range from $-5°$ to $5°$ (e.g., approximately) $0°$, a second Euler angle $\theta$ in a range from $100°$ to $150°$, and a third Euler angle $\Psi$ in a range from $-5°$ to $5°$ (e.g., approximately) $0°$. Such as Euler angle $\theta$ corresponds to an YX cut angle in a range from $10°$ to $60°$. As an example, an LT layer piezoelectric layer 10 can have Euler angles ($\varphi=0°$, $\theta=38°$ to $150°$, $\Psi=0°$).

In certain applications, the piezoelectric layer 10 can be an LN layer having a first Euler angle q in a range from $-5°$ to $5°$ (e.g., approximately) $0°$, a second Euler angle $\theta$ in a range from $100°$ to $150°$, and a third Euler angle $\Psi$ in a range from −5° to 5° (e.g., approximately) 0°. Such a second Euler angle θ corresponds to an YX cut angle in a range from 10° to 60°. As an example, an LN layer piezoelectric layer 10 can have Euler angles (φ=0°, θ=a value in a range from 100° to 150°, Ψ=0°).

In some applications, the piezoelectric layer 10 can be an LN layer having a first Euler angle q in a range from −5° to 5° (e.g., approximately) 0°, a second Euler angle θ in a range from 20° to 50° (e.g., approximately) 38°, and a third Euler angle Ψ in a range from −5° to 5° (e.g., approximately) 0°. Such a second Euler angle θ corresponds to an YX cut angle in a range from −70° to −40°. As an example, an LN layer piezoelectric layer 10 can have Euler angles (φ=0°, θ=a value in a range from 100° to 150°, Ψ=0°).

The IDT electrode 12 can include any suitable IDT electrode material. For example, the IDT electrode can include molybdenum (Mo), aluminum (Al), copper (Cu), Magnesium (Mg), titanium (Ti), tungsten (W), the like, or any suitable combination thereof. The IDT electrode 12 may include alloys, such as AlMgCu, AlCu, etc. In some embodiments, the IDT electrode 12 can include a plurality of layers (e.g., two layers, three layers) of IDT electrode materials. In one example, the IDT electrode 12 can be a multilayer IDT electrode with one or more aluminum layers and one or more molybdenum layers. In another example, the IDS electrode 12 can be a multilayer IDT electrode with one or more aluminum layers and one or more tungsten layers.

As shown in FIG. 1, the IDT electrode 12 can include a pair of IDT electrodes 12A, 12B that face each other, each having one or more (e.g., three) fingers 13A, 13B that extend from a bus bar 15A, 15B to an edge portion. The fingers 13A, 13B are provided in a periodic array, where the pitch between the fingers sets the resonant frequency of the SAW resonator or device 1. The IDT electrode 12 can have one or more gap region(s) g having a length Lg defined between opposite ends of the fingers 13A, 13B of the IDT electrodes 12A, 12B. The IDT electrode 12 can have one or more dummy regions D having a length Ld defined from an edge of the bus bar(s) 15A, 15B to the edge of the gap region(s) g. The IDT electrode 12 can have an interdigital region 17 defined along a length W1 where one or more fingers 13A, 13B of the pair of IDT electrodes 12A, 12B overlap or extend parallel to each other. In one example, the interdigital region 17 can be centered along the length of the SAW resonator 1 (e.g., located generally at the longitudinal center of the SAW resonator 1).

The illustrated surface acoustic wave resonator 1 includes the functional layer 14. The functional layer 14 can be a single crystal layer. The functional layer 14 is an example of a single crystal layer. In one example, the functional layer 14 can be an SiO₂ layer.

The support substrate 16 can be a single crystal layer. The support substrate 16 can include, for example, silicon (Si), sapphire, aluminum oxide (Al₂O₃), aluminum nitride (AlN), ceramic material, etc. The support substrate 16 can have a high impedance relative to the piezoelectric layer 10 and high thermal conductivity. For example, the support substrate 16 can have a higher impedance than an impedance of the piezoelectric layer 10 and a higher thermal conductivity than a thermal conductivity of the piezoelectric layer 10. The support substrate 16 can include a trap rich layer that may be formed at or near a surface of the support substrate 16 facing the functional layer 14.

With reference to FIGS. 2A-2B, the fingers 13A, 13B can have a width W2 and the outer fingers 13A, 13B of each of the IDT electrodes 12A, 12B can be spaced by a distance or pitch L from each other. The piezoelectric layer 10 can have a thickness H1. The IDT electrode 12 (e.g., the IDT electrodes 12A, 12B, such as the fingers 13A, 13B) can have a height $h_1$ above the piezoelectric layer 10.

The thickness H1 of the piezoelectric layer 10 can be selected based on a wavelength λ or L of a surface acoustic wave generated by the surface acoustic wave resonator 1. The pitch of the IDT electrode 12 sets the wavelength λ or L of the surface acoustic wave device 1. The piezoelectric layer 10 can be sufficiently thick to avoid significant frequency variation. In some embodiments, the thickness H1 of the piezoelectric layer 10 can be in a range from, 0.1λ to 2λ, in a range from 0.1λ to 1.5λ, in a range from 0.1λ to 1λ, about 0.3λ. The thickness H1 of the piezoelectric layer 10 can contribute to a quality factor (Q) of the surface acoustic wave resonator 1. When the piezoelectric layer 10 has a thickness less than the wavelength λ of the surface acoustic wave generated by the surface acoustic wave resonator 1, a relatively high quality factor (Q) may be obtained. As noted above, the piezoelectric layer 10 may include any suitable piezoelectric layer, such as a lithium tantalate (LT) layer or a lithium niobate (LN) layer.

The functional layer 14 can have a thickness H2. The thickness H2 of the functional layer 14 can in some embodiments, be in a range from, 0.1λ to 2λ, in a range from 0.1λ to 1.5λ, in a range from 0.1λ to 1λ, about 0.3λ.

The support substrate 16 has a thickness H3. The thickness H3 of the support substrate 16 can be determined at least in part by, for example, the thermal conductivity performance of the surface acoustic wave resonator 1. The thickness H3 of the support substrate 16 can be determined at least in part by, for example, the total thickness of the surface acoustic wave resonator 1. In some embodiments, the thickness H3 of the support substrate 16 can be at least one half the total thickness of the surface acoustic wave resonator 1. In some embodiments, the thickness H3 of the support substrate 16 can be greater than a sum of the thickness H1 of the piezoelectric layer 10 and the thickness H2 of the functional layer 14. In such cases, T3>T1+T2.

With continued reference to FIGS. 1-2B, the surface acoustic wave (SAW) resonator 1 can have a dielectric film or layer 19 disposed over the IDT electrode 12 (e.g., over the pair of IDT electrodes 12A, 12B). In particular, the dielectric layer 19 can be disposed over one or more portions of the IDT electrode 12 outside the interdigital region 17. In the embodiment shown in FIGS. 1-2B, the dielectric layer 19 is disposed over the bus bar(s) 15A, 15B, dummy region D and gap region g of the IDT electrode 12 (e.g., of the pair of IDT electrodes 12A, 12B). The dielectric layer 19 can include a material heavier than a material of the piezoelectric layer 10. In some embodiments, the dielectric film or layer 19 can be a tantalum pentoxide (Ta₂O₅) layer, which advantageously is not very sensitive to shift in coverage of the IDT electrode 12 by the dielectric layer 19 (e.g., shift in the longitudinal direction of the SAW resonator 1 of the coverage of the dielectric layer 19 over the IDT electrode 12). Advantageously, the dielectric layer 19 slows down the propagation velocity, resulting in an improved loss performance for the SAW resonator 1. In some embodiments, the dielectric layer 19 can have a lower acoustic impedance than the piezoelectric layer 10. Additionally, the dielectric layer 19 is advantageously easy to fabricate.

The dielectric layer 19 can have a thickness $h_2$. The thickness $h_2$ of the dielectric layer 19 can in some embodiments be between about 0 L or λ and 0.05 L or λ(e.g., 0λ or L<$h_2$<0.05λ or L), such as 0.01λ, 0.02λ, 0.03λ, 0.04λ and 0.05λ. The thickness $h_2$ can in some embodiments be substantially constant along the dielectric layer 19 (e.g., the thickness $h_2$ can be substantially the same amount over the bus bar(s) 15A, 15B, gap region(s) g, and dummy region(s) D).

With continued reference to FIGS. 1-2B, in some embodiments, the height $h_1$ of the IDT electrode 12 can in some embodiments be between approximately 0.02 L and approximately 0.12 L, such as approximately 0.09 L. The height H1 of the piezoelectric layer 10 can in some embodiments be approximately 0.3 L. The height H2 of the functional layer 14 can in some embodiments be approximately 0.3 L. The dummy region(s) D can in some embodiments have a length Ld of 0 or 1.5 L. The gap region(s) g can in some embodiments have a length of 0.1 L to 0.9 L (e.g., 0.1 L<Lg<0.9 L). The interdigital region 17 can in some embodiments have a length (e.g., aperture) W1 of approximately 15 L, and the fingers 13A, 13B can have a width W2 of approximately 0.25 L. In some embodiments, the pitch of the IDT electrode 12 can sets the wavelength λ or L of the surface acoustic wave resonator or device 1 to approximately 2 □m (e.g., λ or L=2 □m).

Figure 3:
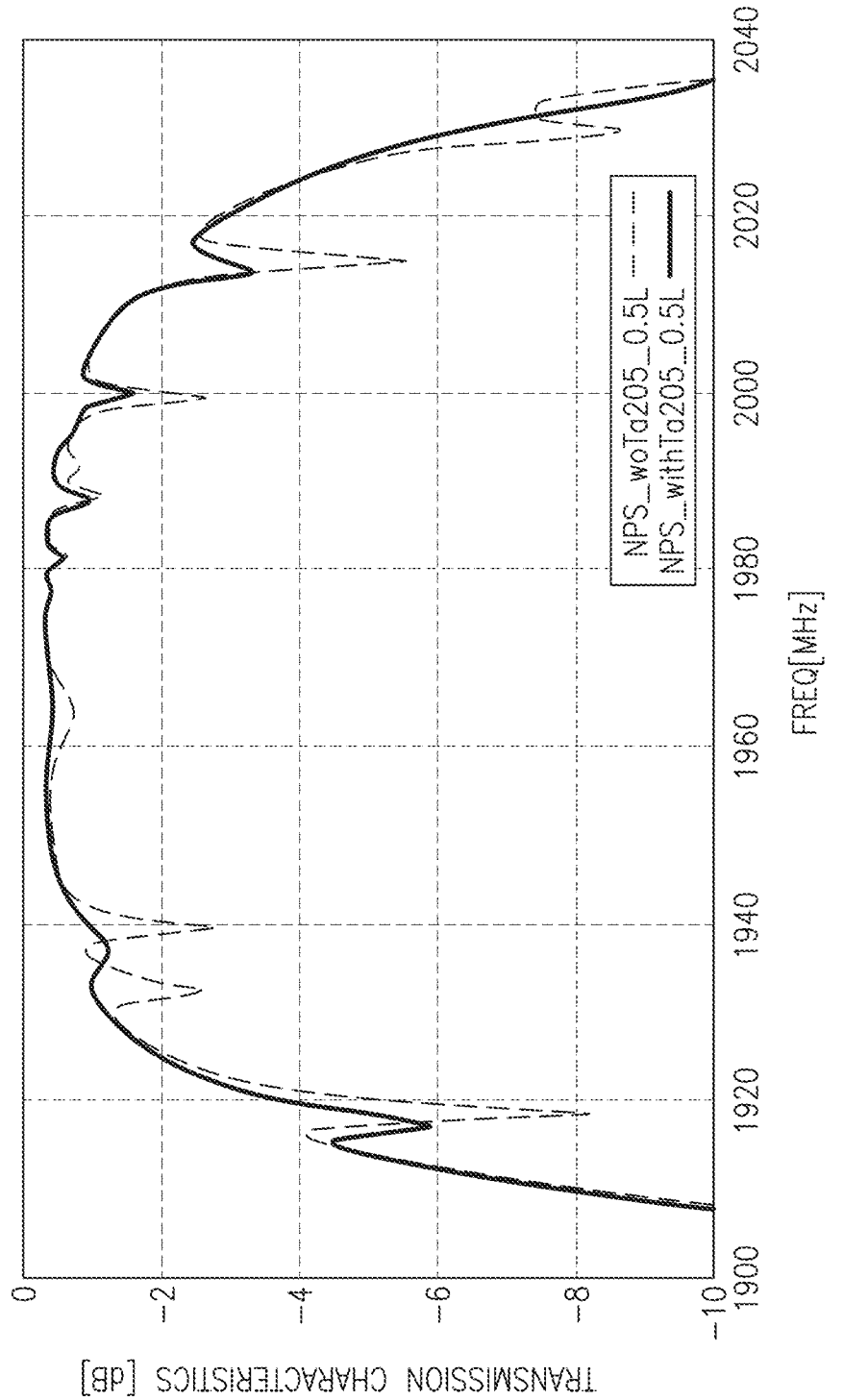
FIG. 3 is a graph of transmission characteristics versus frequency performance for a SAW resonator with a dielectric layer over the interdigital transducer and a SAW resonator without a dielectric layer over the interdigital transducer.

FIG. 3 show a graph of transmission characteristics for the SAW resonator 1 having a dielectric layer 19 being a $Ta_2O_5$ layer with a thickness $h_2$ of 0.05λ (shown as solid line) relative to a SAW resonator without the dielectric layer 19. The graph shows that the SAW resonator 1 having the $Ta_2O_5$ layer (dielectric layer 19) with a thickness $h_2$ of 0.05λ has improved loss performance as compared with the SAW resonator without the dielectric layer 19.

FIGS. 4A-4F show other embodiments of the surface acoustic wave (SAW) resonator 1 with the dielectric layer 19 (e.g., $Ta_2O_5$ layer) disposed over different portions of the IDT electrode 12 (e.g., over the pair of IDT electrodes 12A, 12B) outside of the interdigital region 17.

Figure 4A:
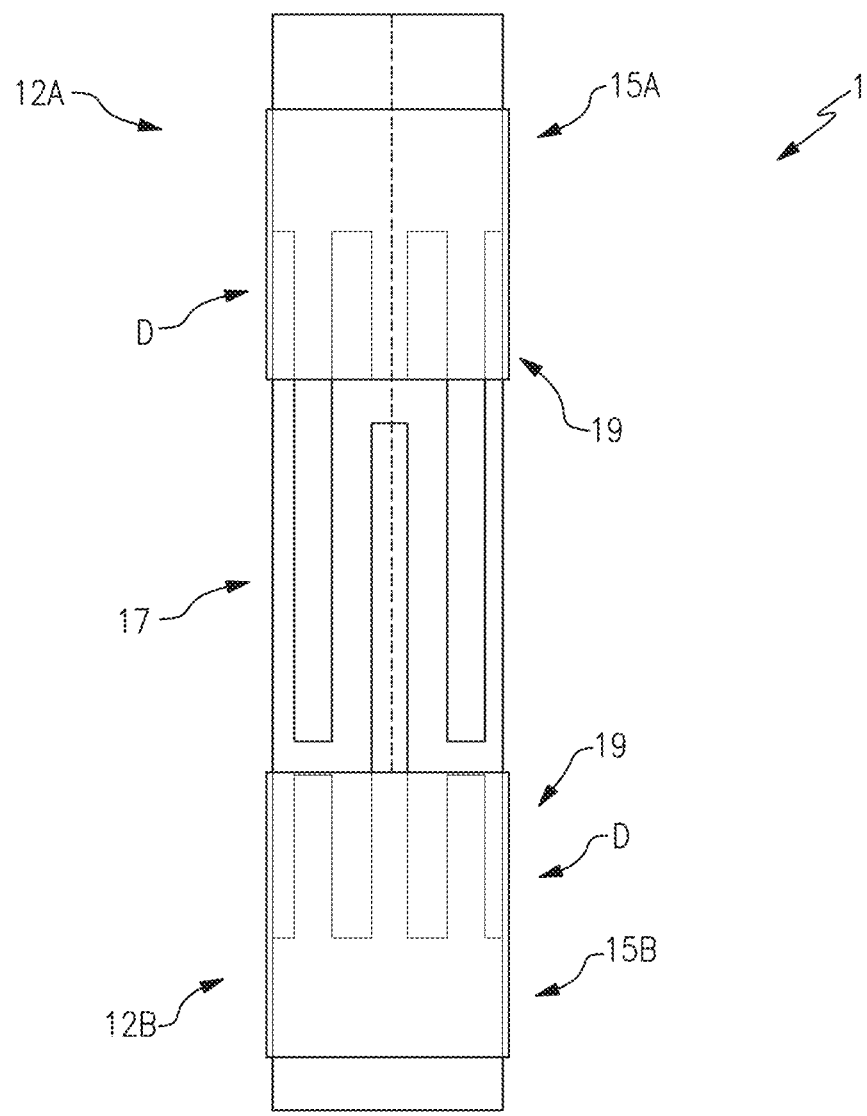
FIG. 4A illustrates a top view of a surface acoustic wave (SAW) resonator according to an embodiment.

FIG. 4A shows the SAW resonator 1 with the dielectric layer 19 (e.g., $Ta_2O_5$ layer) disposed over the bus bar(s) 15A, 15B and the dummy region(s) D of the IDT electrode 12 (e.g., of the pair of IDT electrodes 12A, 12B), and not over the gap region(s) g.

Figure 4B:
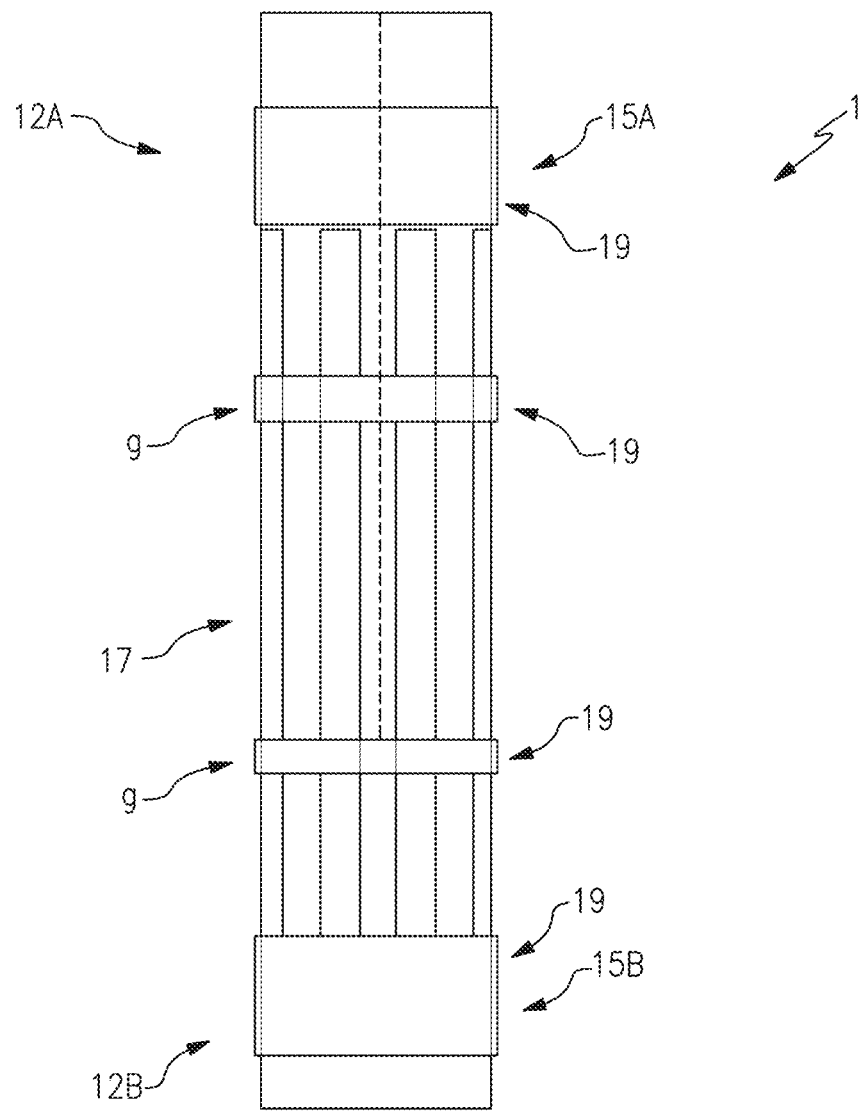
FIG. 4B illustrates a top view of a surface acoustic wave (SAW) resonator according to an embodiment.

FIG. 4B shows the SAW resonator 1 with the dielectric layer 19 (e.g., $Ta_2O_5$ layer) disposed over the bus bar(s) 15A, 15B and the gap region(s) g of the IDT electrode 12 (e.g., of the pair of IDT electrodes 12A, 12B), and not over the dummy region(s) D.

Figure 4C:
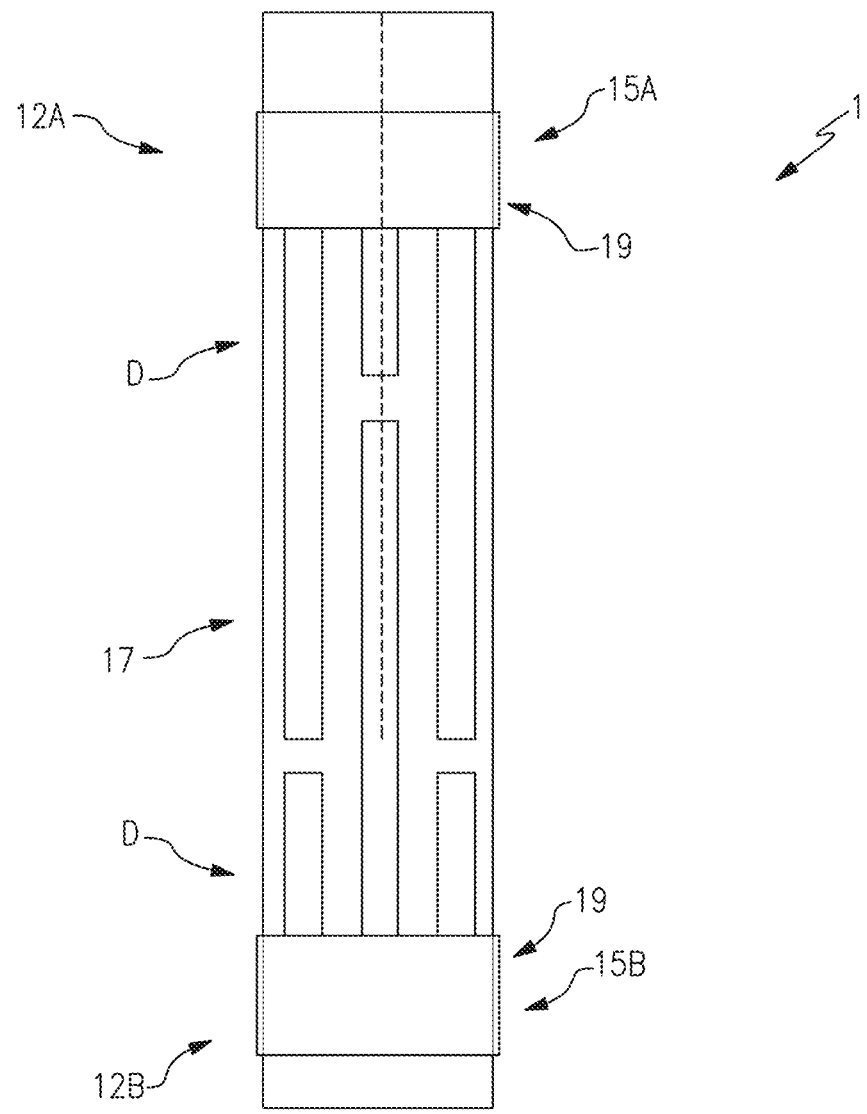
FIG. 4C illustrates a top view of a surface acoustic wave (SAW) resonator according to an embodiment.

FIG. 4C shows the SAW resonator 1 with the dielectric layer 19 (e.g., $Ta_2O_5$ layer) disposed over the bus bar(s) 15A, 15B of the IDT electrode 12 (e.g., of the pair of IDT electrodes 12A, 12B), and not over the gap region(s) g or dummy region(s) D.

Figure 4D:
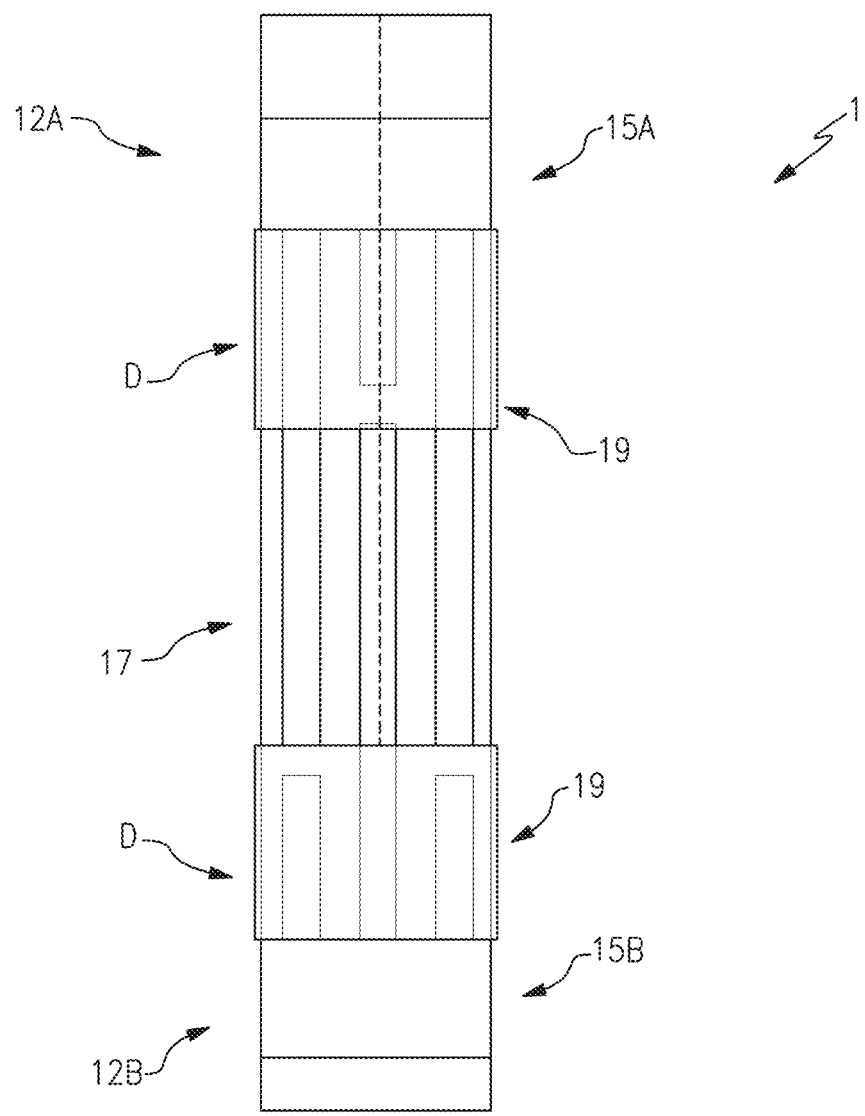
FIG. 4D illustrates a top view of a surface acoustic wave (SAW) resonator according to an embodiment.

FIG. 4D shows the SAW resonator 1 with the dielectric layer 19 (e.g., $Ta_2O_5$ layer) disposed over the dummy region(s) D and gap region(s) g of the IDT electrode 12 (e.g., of the pair of IDT electrodes 12A, 12B), and not over the bus bar(s) 15A, 15B.

Figure 4E:
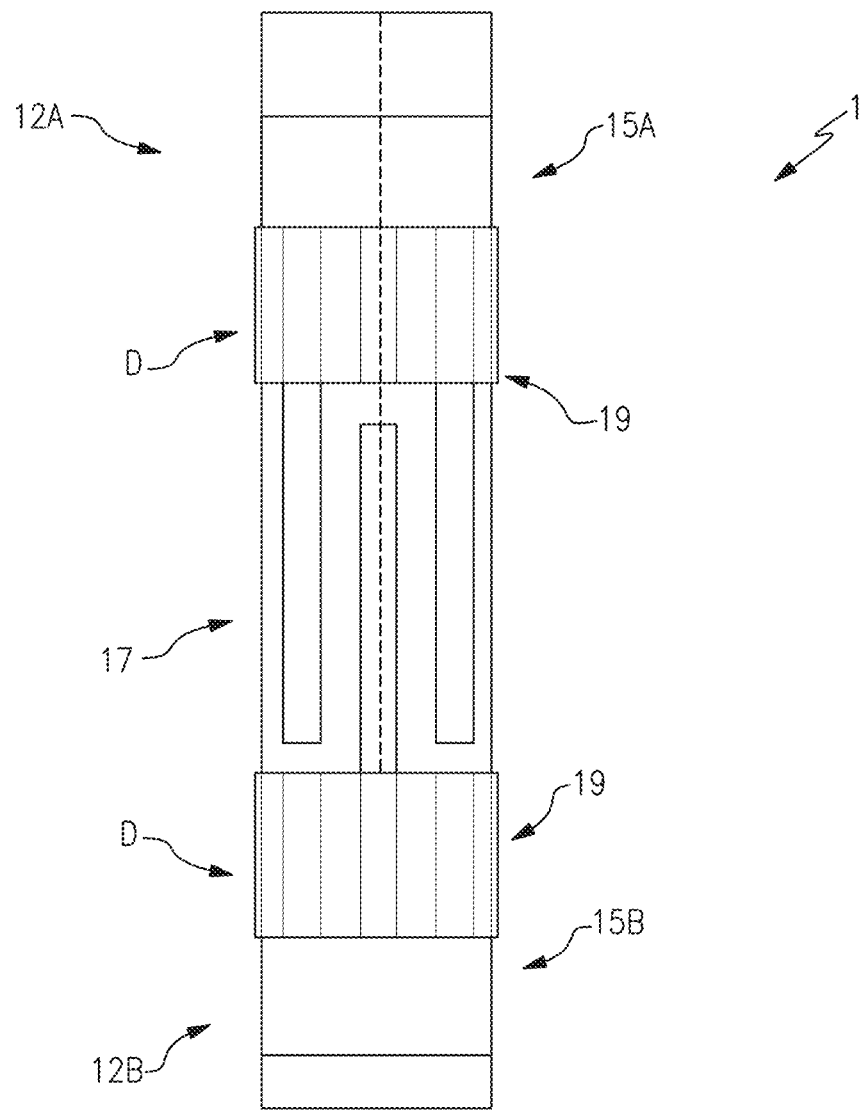
FIG. 4E illustrates a top view of a surface acoustic wave (SAW) resonator according to an embodiment.

FIG. 4E shows the SAW resonator 1 with the dielectric layer 19 (e.g., $Ta_2O_5$ layer) disposed over the dummy region(s) D of the IDT electrode 12 (e.g., of the pair of IDT electrodes 12A, 12B), and not over the bus bar(s) 15A, 15B and gap region(s) g.

Figure 4F:
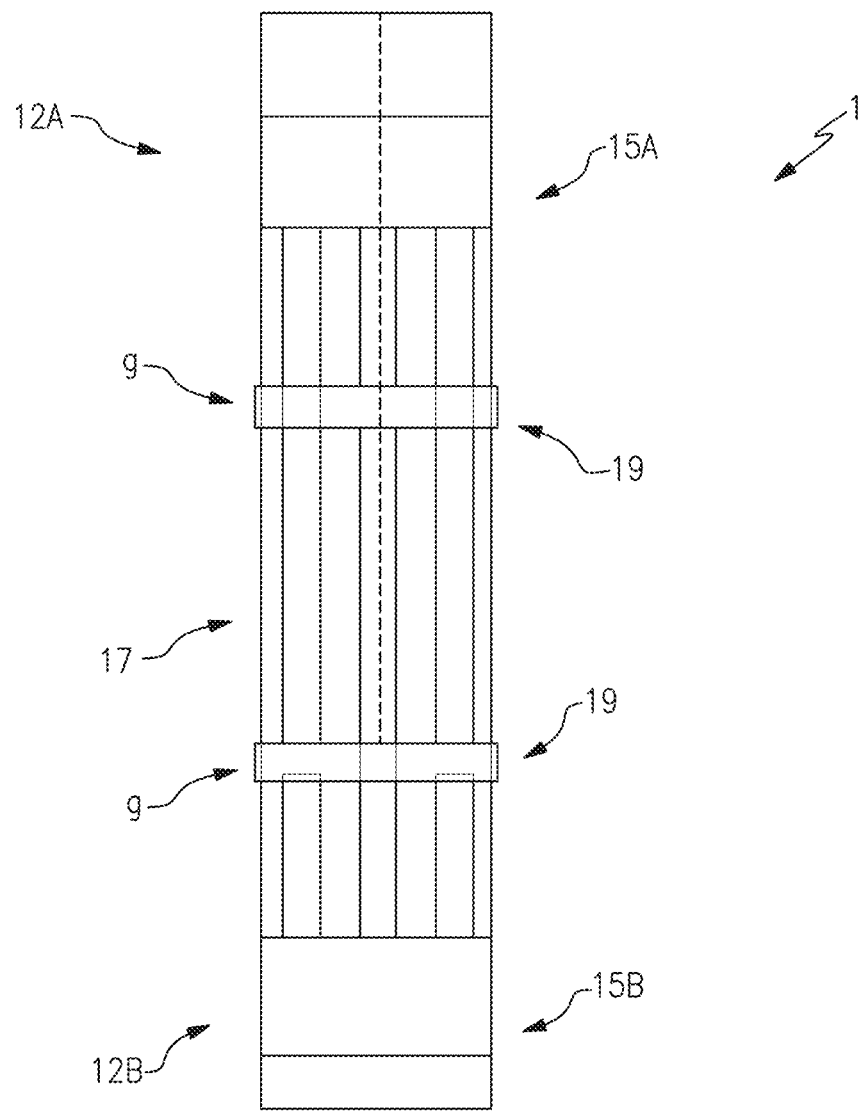
FIG. 4F illustrates a top view of a surface acoustic wave (SAW) resonator according to an embodiment.

FIG. 4F shows the SAW resonator 1 with the dielectric layer 19 (e.g., $Ta_2O_5$ layer) disposed over the gap region(s) g of the IDT electrode 12 (e.g., of the pair of IDT electrodes 12A, 12B), and not over the dummy region(s) D and the bus bar(s) 15A, 15B.

Figure 5:
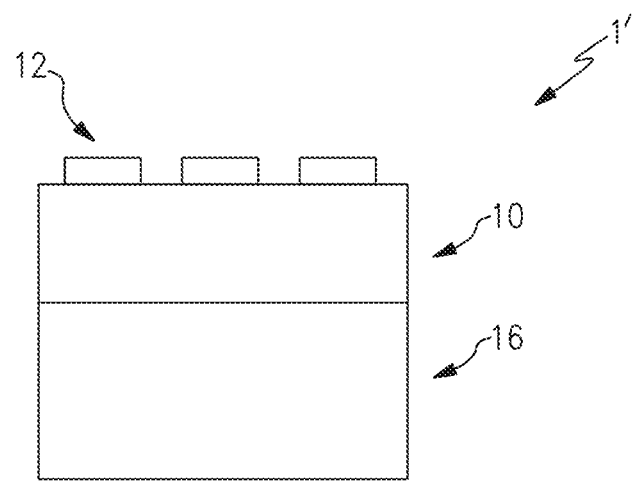
FIG. 5 illustrates a cross-sectional view of a surface acoustic wave (SAW) resonator according to an embodiment.

FIG. 5 shows another embodiment of a surface acoustic wave (SAW) resonator 1'. Some of the features of the SAW resonator 1' are similar to features of the SAW resonator 1 in FIGS. 1-2B. Thus, references numerals used to designate the various components of the SAW resonator 1' are identical to those used for identifying the corresponding components of the SAW resonator 1 in FIGS. 1-2B. Therefore, the structure and description for the various features of the SAW resonator 1 in FIGS. 1-2B are understood to also apply to the corresponding features of the SAW resonator 1' in FIG. 5, except as described below.

The SAW resonator 1' differs from the SAW resonator 1 in that it excludes the functional layer 14. Though not shown, the SAW resonator 1' includes the dielectric layer 19 in the same manner shown in any of the embodiments shown in FIGS. 1-4F. The SAW resonator 1' includes the piezoelectric layer 10 disposed over (e.g., disposed directly over) the support substrate 16. The IDT electrode 12 (e.g., the pair of IDT electrodes 12A, 12B) are disposed over (e.g., disposed directly over) the piezoelectric layer 10.

In one embodiment, the support substrate 16 can be a quartz layer. The quartz layer can be a single crystal quartz layer. The quartz layer is an example of a single crystal layer. Any other suitable single crystal layer that has a thermal conductivity greater than a thermal conductivity of the piezoelectric layer 10 can be implemented.

The quartz layer can be a z-propagation quartz layer. A z-propagation quartz refers to a quartz layer that has a propagation direction along the z-direction of the quartz layer. A surface acoustic wave resonator 1 with a z-propagation quartz layer as the quartz layer can beneficially provide a higher coupling factor ($k^2$), a higher quality factor (Q), and higher power durability by confining the acoustic energy, as compared to a similar surface acoustic wave resonator that does not include a z-propagation quartz layer. A z-propagation quartz layer can reduce higher frequency spurious modes.

The quartz layer has an orientation that can be expressed in Euler angles (φ, θ, Ψ). In certain applications, the quartz layer can be a z-propagation quartz layer having a first Euler angle φ in a range from 40° to 50° (e.g., approximately) 45°, a second Euler angle θ in a range from 80° to 120° (e.g., approximately) 90°, and a third Euler angle Ψ in a range from 85° to 95° (e.g., approximately) 45°. As an example, such a quartz layer can have Euler angles (=45°, 0=90°, Ψ=45°).

In some applications, the quartz layer can be a z-propagation quartz layer having a first Euler angle q in a range from −5° to 5° (e.g., approximately) 0°, a second Euler angle θ in a range from 110° to 150° (e.g., approximately) 132°, and a third Euler angle Ψ in a range from −5° to 5° (e.g., approximately) 0°. As an example, such a quartz layer can have Euler angles (φ=0°, θ=132°, Ψ=0°).

According to some applications, the quartz layer can be a z-propagation quartz layer having a first Euler angle q in a range from −5° to 5° (e.g., approximately) 0°, a second Euler angle θ in a range from 110° to 150° (e.g., approximately) 132°, and a third Euler angle Ψ in a range from 85° to 95° (e.g., approximately) 90°. As an example, such a quartz layer can have Euler angles (φ=0°, θ=132°, Ψ=90°).

Figure 6:
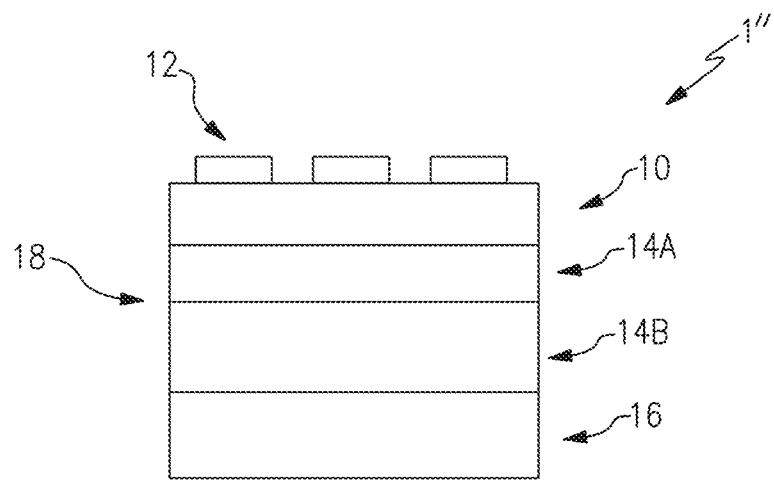
FIG. 6 illustrates a cross-sectional view of a surface acoustic wave (SAW) resonator according to an embodiment.

FIG. 6 shows another embodiment of a surface acoustic wave (SAW) resonator 1". Some of the features of the SAW resonator 1" are similar to features of the SAW resonator 1 in FIGS. 1-2B. Thus, references numerals used to designate the various components of the SAW resonator 1" are identical to those used for identifying the corresponding components of the SAW resonator 1 in FIGS. 1-2B. Therefore, the structure and description for the various features of the SAW resonator 1 in FIGS. 1-2B are understood to also apply to the corresponding features of the SAW resonator 1" in FIG. 6, except as described below.

The SAW resonator 1" differs from the SAW resonator 1 in that the functional layer 14 is divided into a first functional layer 14A and a second functional layer 14B, with a metal layer 18 in between to facilitate bonding of the first and second functional layers 14A, 14B. The SAW resonator 1" includes the piezoelectric layer 10 disposed over (e.g., disposed directly over) the first functional layer 14A. The first functional layer 14A is disposed over (e.g., disposed directly over) the metal layer 18. The metal layer 18 is disposed over (e.g., disposed directly over) the second functional layer 14B. The second functional layer 14B is disposed over (e.g., disposed directly over) the support substrate 16. The IDT electrode 12 (e.g., the pair of IDT electrodes 12A, 12B) are disposed over (e.g., disposed directly over) the piezoelectric layer 10. Though not shown, the SAW resonator 1" includes the dielectric layer 19 in the same manner shown in any of the embodiments shown in FIGS. 1-4F.

Figure 7:
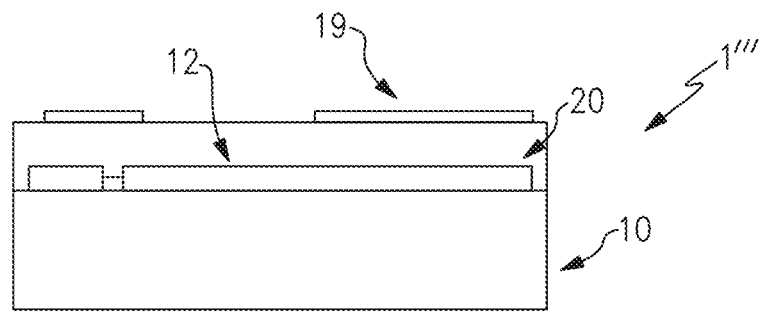
FIG. 7 illustrates a cross-sectional view of a surface acoustic wave (SAW) resonator according to an embodiment.

FIG. 7 shows another embodiment of a portion of a surface acoustic wave (SAW) resonator 1'''. Some of the features of the SAW resonator 1''' are similar to features of the SAW resonator 1 in FIGS. 1-2B. Thus, references numerals used to designate the various components of the SAW resonator 1''' are identical to those used for identifying the corresponding components of the SAW resonator 1 in FIGS. 1-2B. Therefore, the structure and description for the various features of the SAW resonator 1 in FIGS. 1-2B are understood to also apply to the corresponding features of the SAW resonator 1''' in FIG. 7, except as described below.

The SAW resonator 1''' differs from the SAW resonator 1 in that the dielectric layer 19 is disposed over an SiO2 layer 20 that is disposed over the IDT electrode 12 (e.g., over the pair of IDT electrodes 12A, 12B) and the piezoelectric layer 10. Though not shown, the SAW resonator 1'''' can have one or more layers below the piezoelectric layer 10 in accordance with any of the embodiments disclosed herein (e.g., have the functional layer 14 and support substrate 16 of FIGS. 1-2B, the support substrate 16 of FIG. 5, the two functional layers 14A, 14B, metal layer 18 and support substrate 16 of FIG. 6). The dielectric layer 19 can cover the IDT electrode 12 (e.g., the pair of IDT electrodes 12A, 12B) in accordance with any of the embodiments described above (e.g., any of the embodiments shown in FIGS. 1-4F).

An MPS SAW resonator including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more MPS SAW resonators disclosed herein. FR1 can be from 410 MHz to 7.125 GHz, for example, as specified in a current 5G NR specification. In 5G applications, the thermal dissipation of the MPS SAW resonators disclosed herein can be advantageous. For example, such thermal dissipation can be desirable in 5G applications with a higher time-division duplexing (TDD) duty cycle compared to fourth generation (4G) Long Term Evolution (LTE). One or more MPS SAW resonators in accordance with any suitable principles and advantages disclosed herein can be included in a filter arranged to filter a radio frequency signal in a 4G LTE operating band and/or in a filter having a passband that includes a 4G LTE operating band and a 5G NR operating band.

FIG. 8A is a schematic diagram of an example transmit filter 100 that includes surface acoustic wave resonators according to an embodiment. The transmit filter 100 can be a band pass filter. The illustrated transmit filter 100 is arranged to filter a radio frequency signal received at a transmit port TX and provide a filtered output signal to an antenna port ANT. Some or all of the SAW resonators TS1 to TS7 and/or TP1 to TP5 can be a SAW resonator in accordance with any suitable principles and advantages disclosed herein. For instance, one or more of the SAW resonators of the transmit filter 100 can be a surface acoustic wave resonator 1, 1', 1", 1''' of FIGS. 1-7. Alternatively or additionally, one or more of the SAW resonators of the transmit filter 100 can be any surface acoustic wave resonator disclosed herein. Any suitable number of series SAW resonators and shunt SAW resonators can be included in a transmit filter 100.

FIG. 8B is a schematic diagram of a receive filter 105 that includes surface acoustic wave resonators according to an embodiment. The receive filter 105 can be a band pass filter. The illustrated receive filter 105 is arranged to filter a radio frequency signal received at an antenna port ANT and provide a filtered output signal to a receive port RX. Some or all of the SAW resonators RS1 to RS8 and/or RP1 to RP6 can be SAW resonators in accordance with any suitable principles and advantages disclosed herein. For instance, one or more of the SAW resonators of the receive filter 105 can be a surface acoustic wave resonator 1, 1', 1", 1''' of FIGS. 1-7. Alternatively or additionally, one or more of the SAW resonators of the receive filter 105 can be any surface acoustic wave resonator disclosed herein. Any suitable number of series SAW resonators and shunt SAW resonators can be included in a receive filter 105.

Although FIGS. 8A and 8B illustrate example ladder filter topologies, any suitable filter topology can include a SAW resonator in accordance with any suitable principles and advantages disclosed herein. Example filter topologies include ladder topology, a lattice topology, a hybrid ladder and lattice topology, a multi-mode SAW filter, a multi-mode SAW filter combined with one or more other SAW resonators, and the like.

Figure 9:
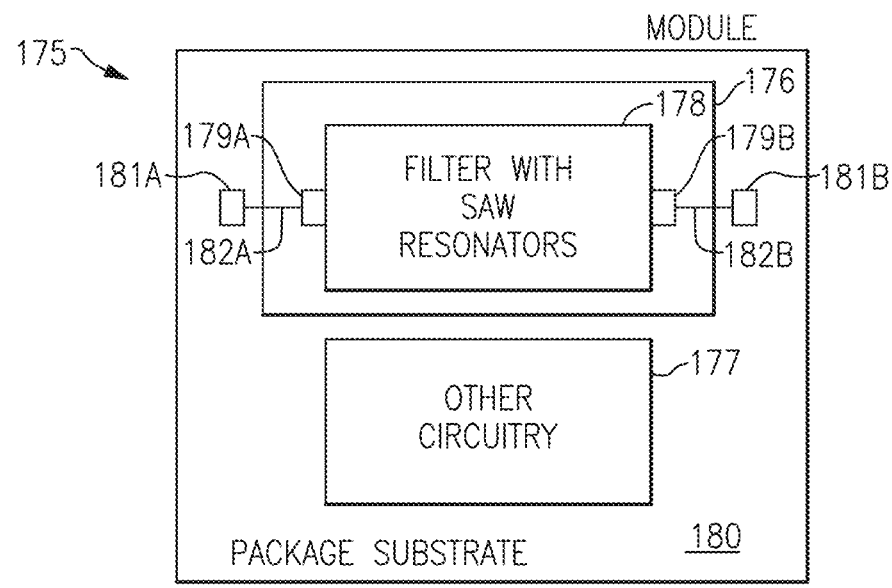
FIG. 9 is a schematic diagram of a radio frequency module that includes a surface acoustic wave resonator according to an embodiment.

FIG. 9 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators disclosed herein. The SAW component 176 can include a SAW die that includes SAW resonators.

The SAW component 176 shown in FIG. 9 includes a filter 178 and terminals 179A and 179B. The filter 178 includes SAW resonators. One or more of the SAW resonators can be implemented in accordance with any suitable principles and advantages of the surface acoustic wave resonator 1, 1', 1", 1''' of FIGS. 1-7 and/or any surface acoustic wave resonator disclosed herein. The terminals 179A and 178B can serve, for example, as an input contact and an output contact. The SAW component 176 and the other circuitry 177 are on a common packaging substrate 180 in FIG. 9. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 10:
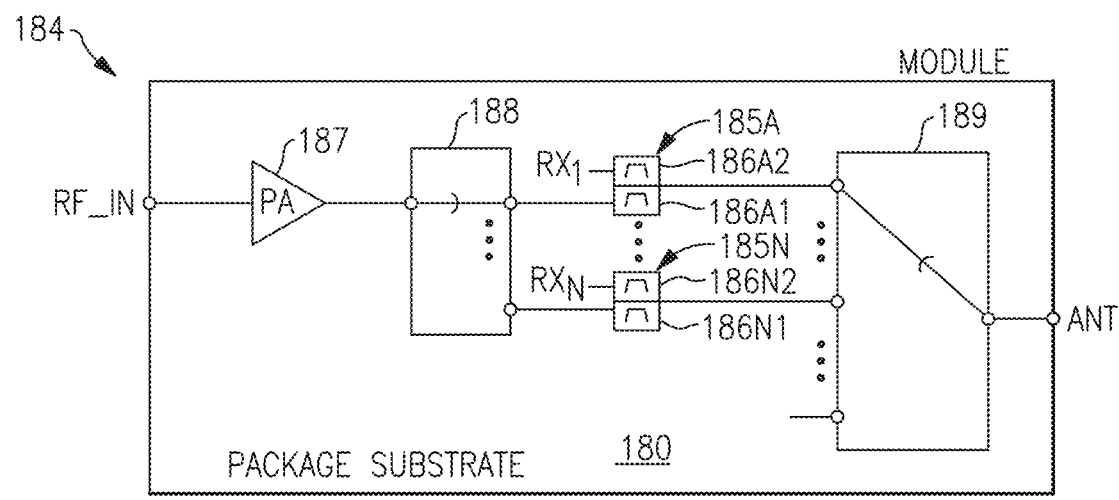
FIG. 10 is a schematic diagram of a radio frequency module that includes filters with surface acoustic wave resonators according to an embodiment.

FIG. 10 is a schematic diagram of a radio frequency module 184 that includes a surface acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators in accordance with any suitable principles and advantages disclosed herein. Similarly, one or more of the receive filters 186A2 to 186N2 can include one or more SAW resonators in accordance with any suitable principles and advantages disclosed herein.... Although FIG. 10 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 11:
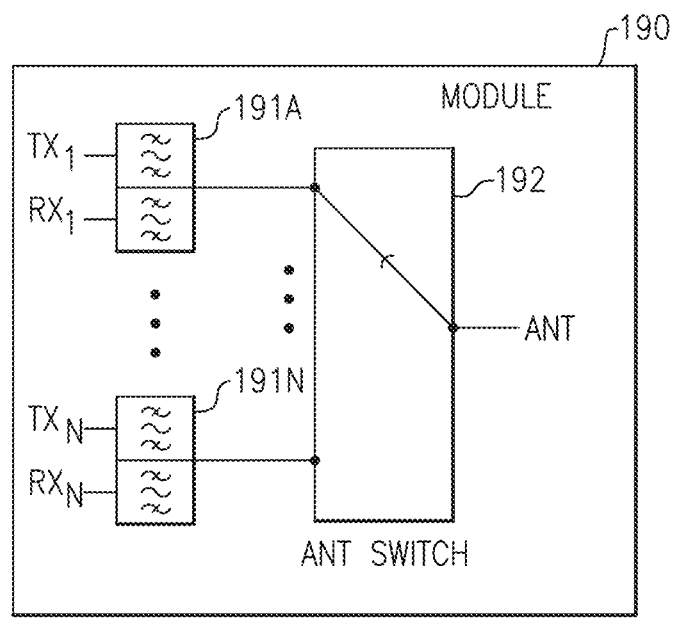
FIG. 11 is a schematic block diagram of a module that includes an antenna switch and duplexers that include a surface acoustic wave resonator according to an embodiment.

FIG. 11 is a schematic block diagram of a module 190 that includes duplexers 191A to 191N and an antenna switch 192. One or more filters of the duplexers 191A to 191N can include any suitable number of surface acoustic wave resonators in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 12A:
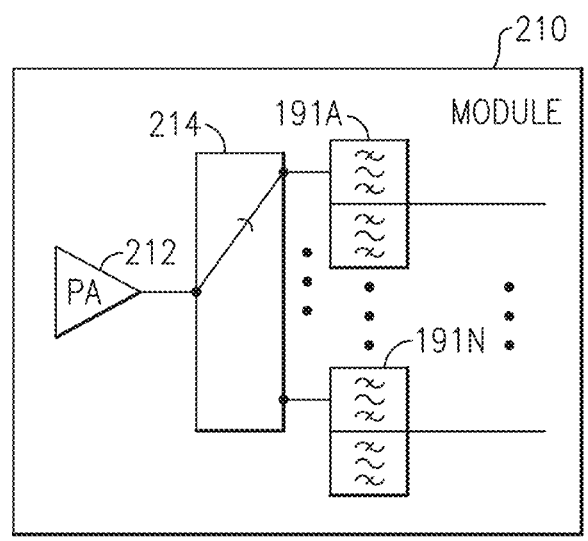
FIG. 12A is a schematic block diagram of a module that includes a power amplifier, a radio frequency switch, and duplexers that include a surface acoustic wave resonator according to an embodiment.

FIG. 12A is a schematic block diagram of a module 210 that includes a power amplifier 212, a radio frequency switch 214, and duplexers 191A to 191N in accordance with one or more embodiments. The power amplifier 212 can amplify a radio frequency signal. The radio frequency switch 214 can be a multi-throw radio frequency switch. The radio frequency switch 214 can electrically couple an output of the power amplifier 212 to a selected transmit filter of the duplexers 191A to 191N. One or more filters of the duplexers 191A to 191N can include any suitable number of surface acoustic wave resonators in accordance with any suitable principles and advantages discussed herein. Any suitable number of duplexers 191A to 191N can be implemented.

Figure 12B:
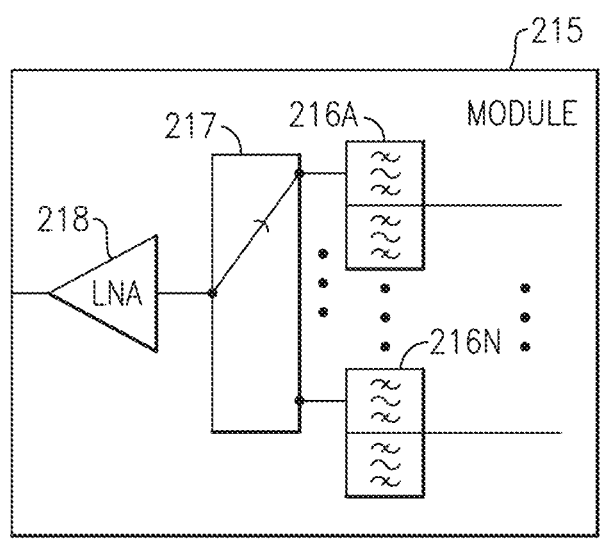
FIG. 12B is a schematic block diagram of a module that includes filters, a radio frequency switch, and a low noise amplifier according to an embodiment.

FIG. 12B is a schematic block diagram of a module 215 that includes filters 216A to 216N, a radio frequency switch 217, and a low noise amplifier 218 according to an embodiment. One or more filters of the filters 216A to 216N can include any suitable number of acoustic wave resonators in accordance with any suitable principles and advantages disclosed herein. Any suitable number of filters 216A to 216N can be implemented. The illustrated filters 216A to 216N are receive filters. In some embodiments (not illustrated), one or more of the filters 216A to 216N can be included in a multiplexer that also includes a transmit filter. The radio frequency switch 217 can be a multi-throw radio frequency switch. The radio frequency switch 217 can electrically couple an output of a selected filter of filters 216A to 216N to the low noise amplifier 218. In some embodiments (not illustrated), a plurality of low noise amplifiers can be implemented. The module 215 can include diversity receive features in certain applications.

Figure 13A:
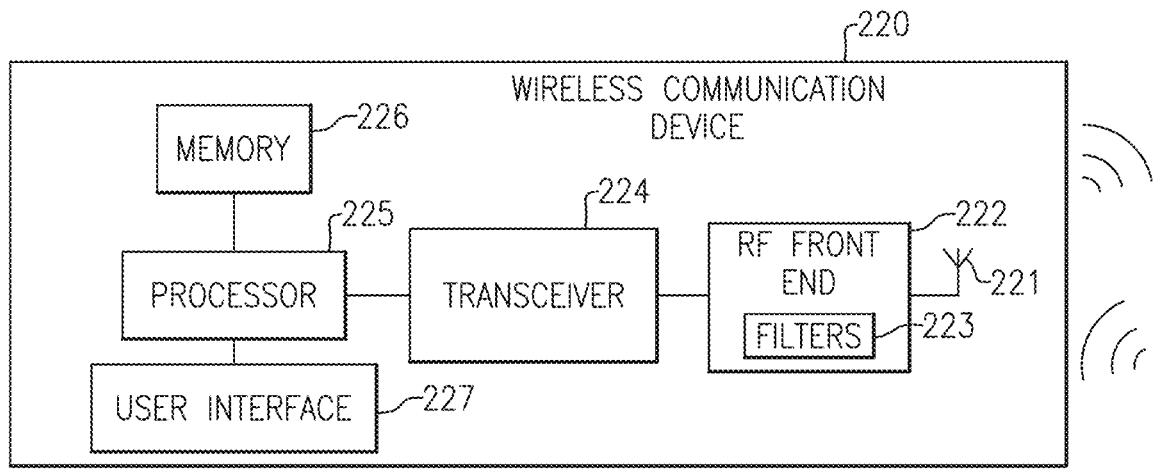
FIG. 13A is a schematic block diagram of a wireless communication device that includes a filter with a surface acoustic wave resonator in accordance with one or more embodiments.

FIG. 13A is a schematic diagram of a wireless communication device 220 that includes filters 223 in a radio frequency front end 222 according to an embodiment. The filters 223 can include one or more SAW resonators in accordance with any suitable principles and advantages discussed herein. The wireless communication device 220 can be any suitable wireless communication device. For instance, a wireless communication device 220 can be a mobile phone, such as a smart phone. As illustrated, the wireless communication device 220 includes an antenna 221, an RF front end 222, a transceiver 224, a processor 225, a memory 226, and a user interface 227. The antenna 221 can transmit/receive RF signals provided by the RF front end 222. Such RF signals can include carrier aggregation signals. Although not illustrated, the wireless communication device 220 can include a microphone and a speaker in certain applications.

The RF front end 222 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards. The filters 223 can include SAW resonators of a SAW component that includes any suitable combination of features discussed with reference to any embodiments discussed above.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Figure 13B:
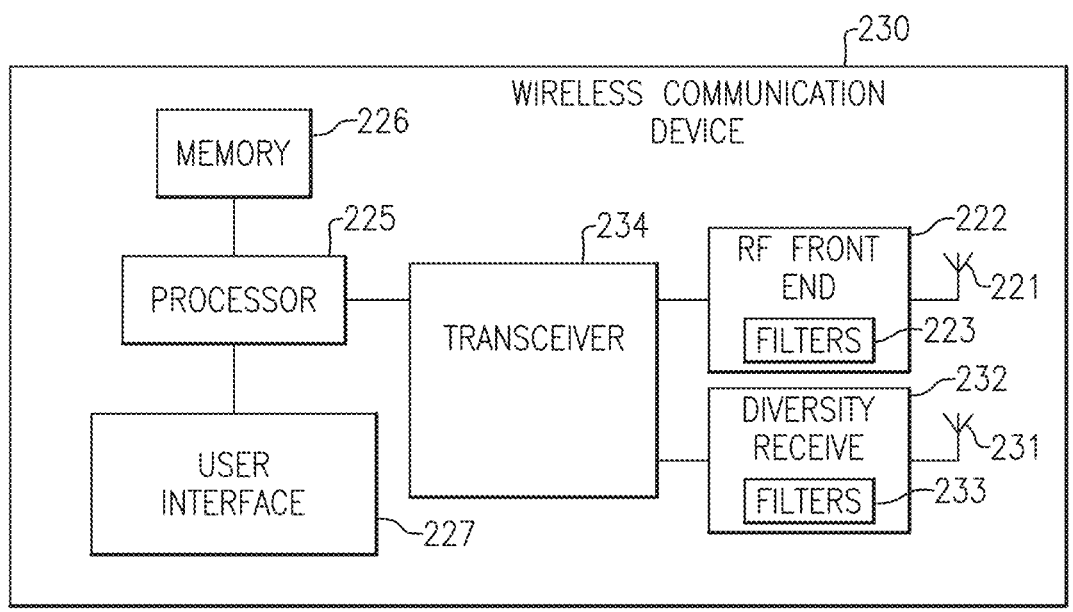
FIG. 13B is a schematic block diagram of another wireless communication device that includes a filter with a surface acoustic wave resonator in accordance with one or more embodiments.

FIG. 13B is a schematic diagram of a wireless communication device 230 that includes filters 223 in a radio frequency front end 222 and a second filter 233 in a diversity receive module 232. The wireless communication device 230 is like the wireless communication device 200 of FIG. 13A, except that the wireless communication device 230 also includes diversity receive features. As illustrated in FIG. 13B, the wireless communication device 230 includes a diversity antenna 231, a diversity module 232 configured to process signals received by the diversity antenna 231 and including filters 233, and a transceiver 234 in communication with both the radio frequency front end 222 and the diversity receive module 232. The filters 233 can include one or more SAW resonators that include any suitable combination of features discussed with reference to any embodiments discussed above.

Although embodiments disclosed herein relate to surface acoustic wave resonators, any suitable principles and advantages disclosed herein can be applied to other types of acoustic wave resonators that include an IDT electrode, such as Lamb wave resonators and/or boundary wave resonators. For example, any suitable combination of features of the tilted and rotated IDT electrodes disclosed herein can be applied to a Lamb wave resonator and/or a boundary wave resonator.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 KHz to 300 GHz, such as in a frequency range from about 450 MHz to 8.5 GHZ. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave device comprising:
at least first and second interdigital transducer electrodes above a piezoelectric layer that is above a functional layer, the first interdigital transducer electrode having a first a bus bar and a first plurality of fingers extending from the first bus bar, the second interdigital transducer electrode having a second bus bar and a second of plurality of fingers extending from the second bus bar, the first and second interdigital transducer electrodes having an interdigital region where the first and second plurality of fingers interdigitate with each other and at least one gap region where the first and second plurality of fingers do not interdigitate with each other; and a dielectric layer above portions of the first and second bus bars and a portion of the at least one gap region but not above the interdigital region.

2. The surface acoustic wave device of claim 1 wherein the dielectric layer is a tantalum pentoxide layer.

3. The surface acoustic wave device of claim 1 wherein the functional layer is a single crystal layer.

4. The surface acoustic wave device of claim 1 wherein the functional layer is a silicon dioxide layer.

5. The surface acoustic wave device of claim 1 wherein the functional layer is a quartz layer.

6. The surface acoustic wave device of claim 1 wherein the functional layer includes a first functional layer and a second functional layer, and a metal layer is between the first functional layer and the second functional layer.

7. The surface acoustic wave device of claim 1 further including a silicon dioxide layer disposed between the dielectric layer and the first and second interdigital transducer electrodes.

8. The surface acoustic wave device of claim 1 wherein the first and second interdigital transducer electrodes have at least a first dummy region defined from an edge of a first bus bar to an edge of a first gap region, and the dielectric layer is disposed over a portion of the first dummy region.

9. The surface acoustic wave device of claim 1 wherein the dielectric layer has a thickness of between 0.01 L and 0.04 L, where L is a wavelength of a wave generated by the surface acoustic wave device.

10. The surface acoustic wave device of claim 1 wherein the piezoelectric layer is one of a lithium tantalate layer and a lithium niobate layer.

11. An acoustic wave filter comprising a surface acoustic wave resonator configured to filter a radio frequency signal, the surface acoustic wave resonator including at least a first and second interdigital transducer electrodes above a piezoelectric layer that is above a functional layer, the first interdigital transducer electrode having a first bus bar and a first plurality of finger extending from the first bus bar, the second interdigital transducer electrode having a second bus bar and a second plurality of fingers extending from the second bus bar, the first and second interdigital transducer electrodes having an interdigital region where the first and second plurality of fingers interdigitate with each other, and at least one gap region where the first and second plurality of fingers do not interdigitate with each other, and a dielectric layer above portions of the first and second bus bars and a portion of the at least one gap region but not above the interdigital region.

12. The acoustic wave filter of claim 11 wherein the dielectric layer is a tantalum pentoxide layer.

13. The acoustic wave filter of claim 11 wherein the functional layer is a single crystal layer.

14. The acoustic wave filter of claim 11 wherein the functional layer is a silicon dioxide layer.

15. The acoustic wave filter of claim 11 wherein the functional layer is a quartz layer.

16. The acoustic wave filter of claim 11 wherein the functional layer includes a first functional layer and a second functional layer, and a metal layer is between the first functional layer and the second functional layer.

17. The acoustic wave filter of claim 11 further including a silicon dioxide layer disposed between the dielectric layer and the first and second interdigital transducer electrodes.

18. The acoustic wave filter of claim 11 wherein the first and second interdigital transducer electrodes have at least a first dummy region defined from an edge of the first bus bar to an edge of a first gap region, and the dielectric layer is disposed above a portion of the first dummy region.

19. A wireless communication device comprising:
an antenna; and
a front end module including one or more surface acoustic wave resonators configured to filter a radio frequency signal associated with the antenna, each surface acoustic wave resonator including at least first and second interdigital transducer electrodes above a piezoelectric layer that is above a functional layer, the first interdigital transducer electrode having a first bus bar and a first plurality of fingers extending from the bus bar, the second interdigital transducer electrode having a second bus bar and a second plurality of fingers extending from the second bus bar, the first and second interdigital transducer electrodes having an interdigital region wherein the first and second plurality of fingers interdigitate with each other and at least one gap region where the first and second plurality of fingers do not interdigitate with each other, and a dielectric layer above portions of the first and second bus bars and a portion of the least one gap region but not above the interdigital region.

20. The wireless communication device of claim 19 wherein the dielectric layer is a tantalum pentoxide layer.

* * * * *